United States Patent
Yasuda et al.

(10) Patent No.: US 6,168,669 B1
(45) Date of Patent: Jan. 2, 2001

(54) SUBSTRATE HOLDING APPARATUS AND SUBSTRATE PROCESS SYSTEM

(75) Inventors: Kenji Yasuda; Naruaki Iida, both of Kumamoto (JP)

(73) Assignee: Tokyo Electron Limited (JP)

( * ) Notice: Under 35 U.S.C. 154(b), the term of this patent shall be extended for 0 days.

(21) Appl. No.: 09/250,394

(22) Filed: Feb. 16, 1999

(30) Foreign Application Priority Data

Feb. 24, 1998 (JP) .................................................. 10-060478

(51) Int. Cl.[7] .................................................. C23C 16/00
(52) U.S. Cl. .......................... 118/728; 118/729; 118/719
(58) Field of Search .................................. 118/728, 719, 118/729, 715; 396/611

(56) References Cited

U.S. PATENT DOCUMENTS

| | | | |
|---|---|---|---|
| 5,028,955 | 7/1991 | Hayashida et al. | 355/53 |
| 5,169,453 * | 12/1992 | Takagi | 118/728 |
| 5,609,688 * | 3/1997 | Hayashi et al. | 118/715 |
| 5,626,675 | 5/1997 | Sakamoto et al. | 118/663 |
| 5,826,129 * | 10/1998 | Hasebe et al. | 396/611 |

* cited by examiner

Primary Examiner—Richard Bueker
Assistant Examiner—P. Hassanzadeh
(74) Attorney, Agent, or Firm—Rader, Fishman & Grauer

(57) ABSTRACT

Supporting members are provided at three places, for example, on a frame section of a pair of tweezers. Each supporting member has a tapered face as an inclined guide for allowing a rim portion of a substrate to slide down to be guided to a predetermined position. A vertical wall which is formed continuing from the tapered face and being nearly perpendicular to a supported face of a wafer is provided at an upper end of the tapered face. Even when the rim portion of the wafer rises along the tapered face with the movement of the tweezers, the rim portion stops by hitting against the vertical wall, thereby preventing the wafer from falling from the tweezers.

13 Claims, 9 Drawing Sheets

SUBSTRATE HOLDING APPARATUS AND SUBSTRATE PROCESS SYSTEM

BACKGROUND OF THE INVENTION

The present invention relates to a substrate holding apparatus, for example, a pair of tweezers or the like for holding a substrate and a substrate process system.

In the photoresist process in semiconductor device fabrication, resist solution is supplied to a substrate such as a semiconductor wafer (referred to as a wafer hereinafter) or the like to form a resist film. After the resist film is exposed to a predetermined pattern, developing solution is supplied to the wafer to develop. A coating and developing apparatus is conventionally used to perform the sequence of treatments as above.

The coating and developing apparatus includes process units which individually perform a sequence of treatments needed for coating and developing the wafer, for example, hydrophobic process (adhesion process) for improving fixing of resist, resist coating process for coating resist solution, heat treatment for curing the resist film by heating the resist solution coated wafer, heat treatment for heating the exposed wafer at a predetermined temperature, developing process for performing development to the exposed wafer, and the like.

A transfer apparatus is used to transfer the wafer between the process units, and the transfer apparatus is provided with a pair of tweezers to transfer the wafer between the process units. A pair of tweezers has a frame section having a configuration surrounding a half or more of a periphery of the wafer. Three supporting members are provided on the inner periphery of the frame section. Each supporting member has a rear face supporting section horizontally supporting the wafer and an inclined guide with an inclination of, for example, 45 degrees. Each supporting member is attached by inserting a bolt into a hole for bolt.

Incidentally, there is the possibility that the wafer received by the tweezers is not horizontally supported to the rear face supporting section, owing to slippage of the position of the substrate in the process units or the position where the tweezers stops when the tweezers receives the wafer. Therefore, the tweezers are conventionally provided with the inclined guide for allowing the wafer to slide down to the rear face supporting section. Consequently, even when the tweezers stop getting out of a predetermined stop position and the wafer W is received at an irregular position, the wafer W slides down with a rim portion thereof touching the inclined guide to a regular position and is horizontally supported by the rear face supporting section.

Friction is occasionally generated between the rim portion of the wafer and the inclined guide so that the wafer W does not slide down to the predetermined rear face supporting section. When the tweezers moves in the state as above, there is the possibility that the wafer W falls from the tweezers and slips along the inclined guide off the tweezers. Accordingly, the moving speed of the tweezers is limited for preventing the wafer W from falling, thereby it is difficult to improve throughput in the prior art.

BRIEF SUMMARY OF THE INVENTION

An object of the present invention is to provide a substrate holding apparatus and a substrate process system capable of preventing the substrate from falling at the time of moving, even when the wafer W is received in an irregular position.

Another object of the present invention is to provide a holding apparatus and a process system for a substrate which does not give a limit to a moving speed of a pair of tweezers for giving and receiving the substrate such as a wafer or the like and can improve throughput.

According to the first aspect of the present invention, there is provided a substrate holding apparatus which comprises a frame section formed surrounding a half or more of a periphery of the substrate, an arm section supporting the frame section, and a plurality of supporting members which are provided on the inner periphery of the frame section, each of the supporting members having an inclined guide allowing a rim portion of the substrate to slide down to be guided to a predetermined position, a rear face supporting section supporting a rear face of the guided substrate, and a vertical wall formed continuing from the inclined guide and being nearly perpendicular to the supported face of the substrate at an upper end of the inclined guide.

According to the second aspect of the present invention, there is provided a substrate supporting apparatus which comprises a frame section formed surrounding a half or more of a periphery of the substrate, an arm section supporting the frame section, and a plurality of supporting members which are provided on the inner periphery of the frame section, each of the supporting members having an inclined guide allowing a rim portion of the substrate to slide down to be guided to a predetermined position, a rear face supporting section supporting a rear face of the guided substrate, and an inclined wall formed continuing from the inclined guide and being further inclined from a perpendicular direction toward the inclined guide side at an upper end of the inclined guide.

According to the third aspect of the present invention, there is provided a substrate holding apparatus which comprises a plurality of process units performing a predetermined process respectively to the substrate and a transfer unit having a pair of tweezers which are movable forward and backward to each process unit for receiving and transferring the substrate between the process units, in which the tweezers include a frame section formed surrounding a half or more of a periphery of the substrate, an arm section supporting the frame section, and a plurality of supporting members provided on the inner periphery of the frame section, each of the supporting members having an inclined guide to allow a rim portion of the substrate to slide down to be guided to a predetermined position, a rear face supporting section for supporting a rear face of the guided substrate, and a vertical wall formed continuing from the inclined guide and being nearly perpendicular to a supported face of the substrate at an upper end of the inclined guide.

According to the fourth aspect of the present invention, there is provided a substrate holding apparatus which comprises a plurality of process units for performing a predetermined process respectively to the substrate, and a transfer unit having a pair of tweezers which are movable forward and backward to each process unit for receiving and transferring the substrate between the process units, in which the tweezers include a frame section formed surrounding a half or more of a periphery of the substrate, an arm section supporting the frame section, and a plurality of supporting members provided on the inner periphery of the frame section having an inclined guide to allow a rim portion of the substrate to slide down to be guided to a predetermined position, a rear face supporting section for supporting a rear face of the guided substrate, and an inclined wall formed continuing from the inclined guide and being further inclined from a perpendicular direction toward the inclined guide side at an upper end of the inclined guide.

In the present invention, even when the substrate holding apparatus is moved in the state where a rim portion of the substrate is caught at the inclined guide, the rim portion touches or hits against the vertical wall provided at an upper end of the inclined guide, therefore the vertical wall fulfills the function as a stopper. Accordingly, the substrate can be prevented from falling from the holding apparatus for a substrate.

In the present invention, an inclined wall which is further inclined toward the inclined guide side than the vertical wall may be formed instead of the vertical wall.

In this case, the rim portion of the substrate touches or hits the inclined wall more easily than that in the case where the vertical wall is used. Accordingly, the function as a stopper of the inclined wall improves further than that in the case where the vertical wall is used, thereby further securely preventing the substrate from falling from the substrate holding apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
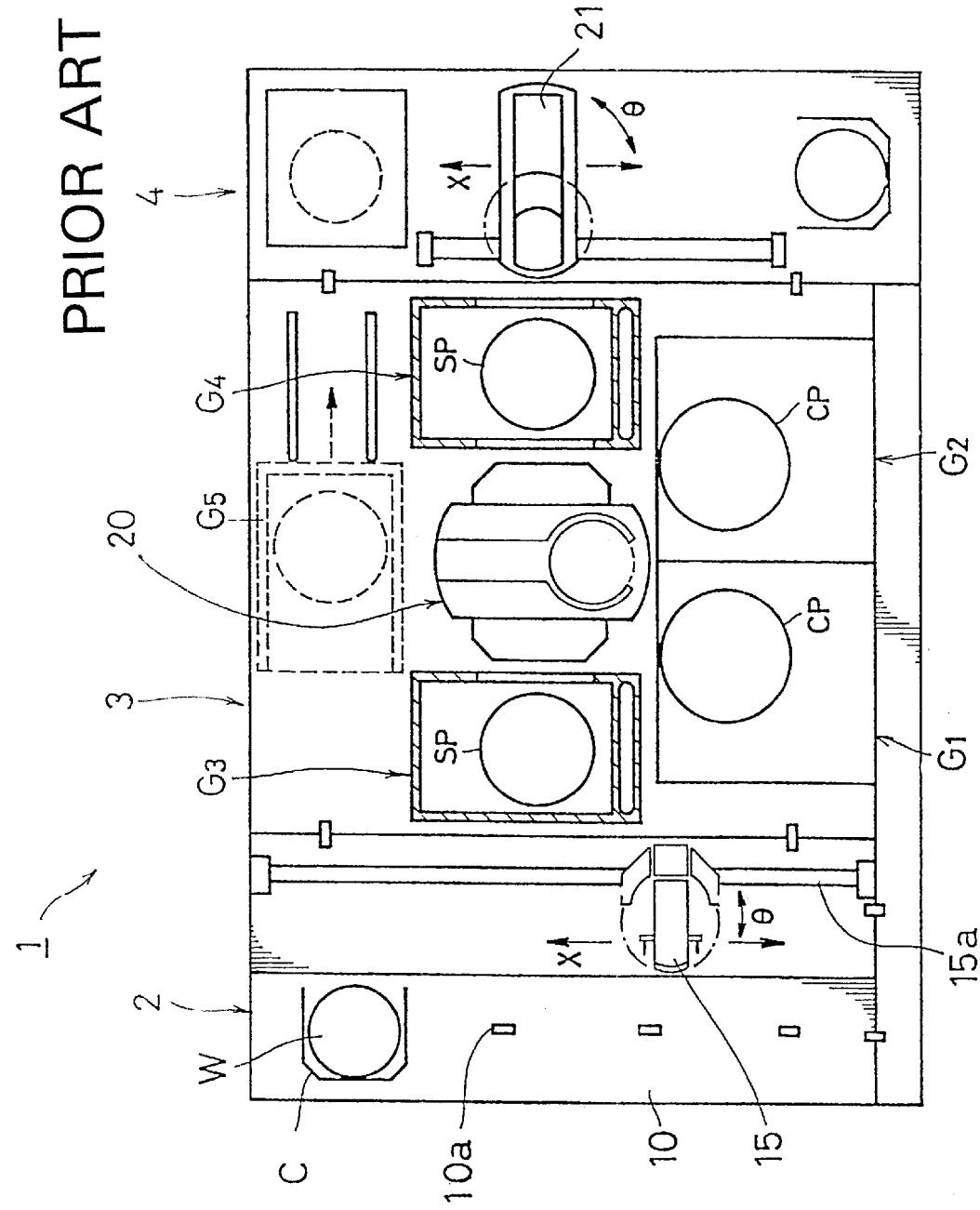
FIG. 1 is a plane view showing an appearance of a coating and developing system having a main transfer unit with a pair of tweezers according to an embodiment of the present invention.
Figure 2:
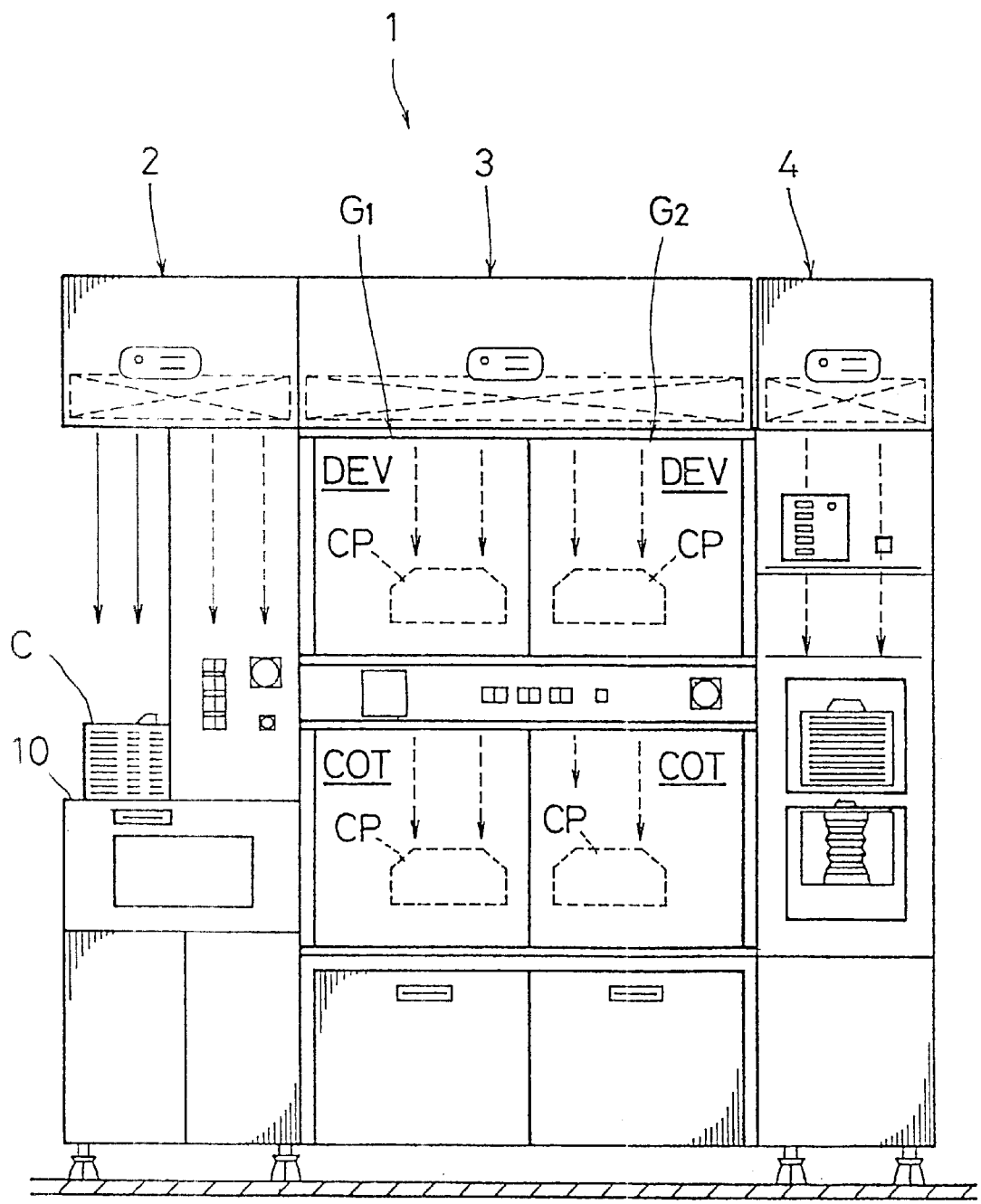
FIG. 2 is an explanatory view showing the coating and developing system in FIG. 1 seen from a front side.
Figure 3:
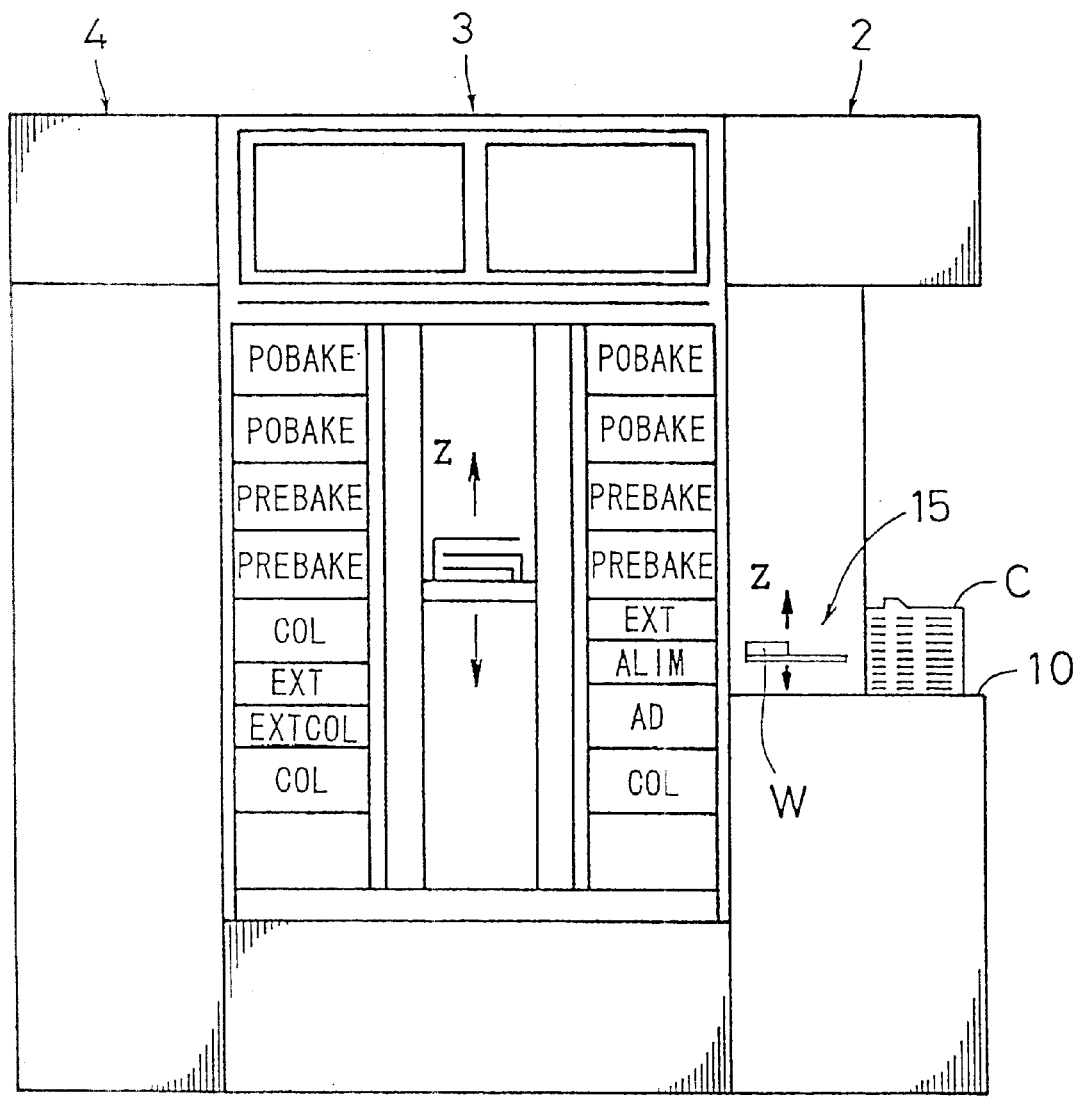
FIG. 3 is an explanatory view showing the coating and developing system in FIG. 1 seen from a back side.

An embodiment according to the present invention will be described hereinafter with reference to the accompanying drawings. The embodiment is realized as a pair of tweezers for transferring a wafer between process units. FIGS. 1 to 3 show an appearance of a coating and developing system which is provided with a transfer apparatus having the tweezers according to the embodiment. FIGS. 1, 2, and 3 show aspects seen from a plane, from a front side, and from a back side respectively.

As shown in FIG. 1, a coating and developing system 1 has a configuration in which a cassette station 2 for loading and unloading twenty-five wafers W, for example, in units of a cassette into and from the coating and developing system 1 with respect to an external apparatus and transferring the wafers to and from a cassette C, a process station 3 in which various kinds of single wafer processing type process units are arranged at multi-stages and each process unit subjects a predetermined process to the wafers W one by one in a coating and developing process, and an interface section 4 for sending and receiving the wafer to and from an aligner (not shown) which is disposed adjacent to the process station 3 are integrally connected.

In the cassette station 2, four cassettes C, for example, can be mounted with respective inlets and outlets for the wafers W opening to the process station 3 side at positions of positioning projections 10a on a cassettes mounting table 10 as a mounting section in a line along an X-direction (a vertical direction in FIG. 1). A wafer carriage 15, which can move in the direction of disposition of the cassettes C (the X-direction) and in the direction of disposition of the wafers W stored in the cassettes C (a Z-direction; a vertical direction), is movable along a transfer path 15a to be selectively accessible to each cassette C.

The wafer carriage 15 is rotatable in a θ-direction and accessible to an alignment unit (ALIM) and an extension unit (EXT) included in multi-stage units of a third process unit group G3 on the process station 3 side as described later.

In the process station 3, a main transfer unit 20 is placed in a center portion thereof. Around the main transfer unit 20, one or various kinds of process units are arranged at multi-stages to compose a process unit group. In the coating and developing system 1, five process unit groups G1, G2, G3, G4, and G5 can be arranged. The first and the second process unit groups G1 and G2 can be arranged on the front side of the coating and developing system 1, the third process unit group G3 can be disposed adjacent to the cassette station 2, the fourth process unit group G4 can be disposed adjacent to the interface section 4, and the fifth process unit G5 shown with a dashed line can be disposed on the back side.

As shown in FIG. 2, in the first process unit group G1, two spinner-type process units for mounting the wafer W on a spin chuck in a cup CP and performing predetermined treatments, for example, a resist coating unit (COT) and a developing unit (DEV) are arranged at two stages from the bottom in order. Also in the second process unit group G2 similarly to the first process unit group G1, two spinner-type process units, for example, the resist coating unit (COT) and the developing unit (DEV) are arranged at two stages from the bottom in order.

As shown in FIG. 3, in the third process unit group G3, oven-type process units in which the wafer W is mounted on a mounting table to perform predetermined treatments, for example, a cooling process unit (COL) for performing cooling process, the aligment unit (ALIM) for positioning the wafer W, the extension unit (EXT) for keeping the wafer on standby, a prebaking unit (PREBAKE) and a postbaking unit (POBAKE) for performing heat process, an adhesion unit (AD) for improving fixing of resist and the wafer W, are vertically arranged at eight stages.

A wafer carriage 21 is disposed in the center portion of the interface section 4. The wafer carriage 21 is movable in the X-direction and in the Z-direction (the vertical direction) and rotatable in the θ-direction to be accessible to both the extension unit (EXT) included in the fourth process unit group G4 on the process station 3 side and a wafer delivery table (not shown) on the aligner unit (not shown) side.

Figure 4:
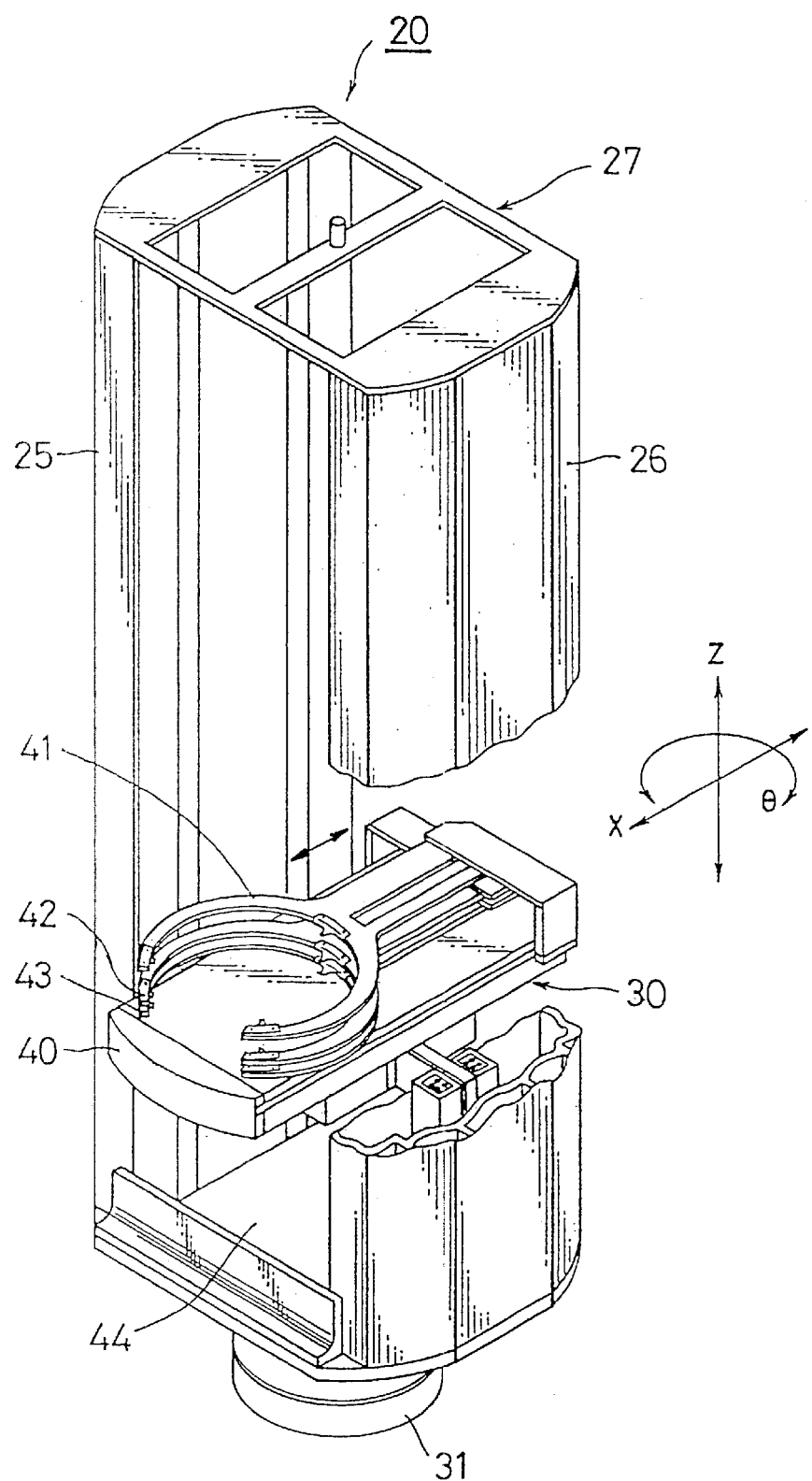
FIG. 4 is a perspective view showing an appearance of the main transfer unit.

The coating and developing system 1 is constructed as described hereinbefore. Next, the main transfer unit 20 included in the coating and developing system 1 will be explained. FIG. 4 is a perspective view showing an appearance of the main transfer unit 20. The main transfer unit 20 is provided with a wafer carriage 30 movable in the vertical direction (the Z-direction) inside a cylindrical supporter 27 constructed by a pair of wall sections 25 and 26 which are connected each other at respective top ends and bottom ends and face each other. The cylindrical supporter 27 is connected to the rotation shaft of a motor 31 and rotates together with the wafer carriage 30 on the aforesaid rotation shaft by rotation driving force of the motor 31. Accordingly, the wafer carriage 30 is rotatable in the θ-direction.

Three tweezers, for example, according to the embodiment of the present invention are provided on a carriage base 40 of the wafer carriage 30. Each of the tweezers 41, 42, and 43 as apparatus for holding the substrate has a shape and a size passable through a side opening 44 between the wall sections 25 and 26 of the cylindrical supporter 27 to be movable forward and rearward along the X-direction.

The tweezers 41, 42, and 43 basically have the same configuration, therefore the tweezers 41 positioned at uppermost position thereof will be explained hereinafter as a representative.

Figure 5:
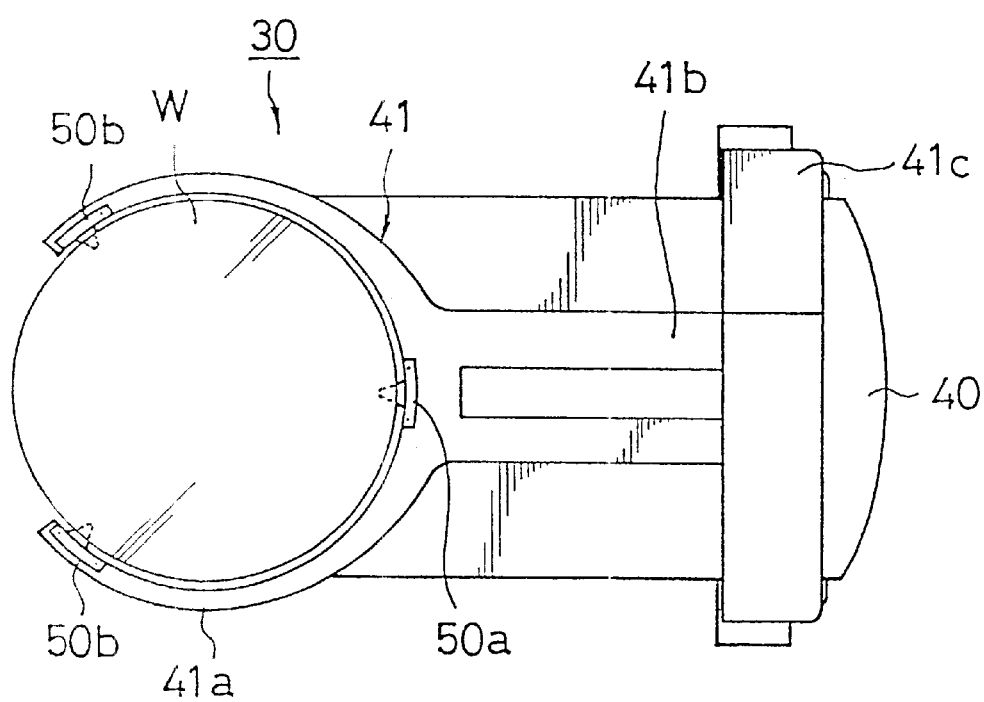
FIG. 5 is a plane view showing the tweezers according to the embodiment of the present invention.

The tweezers 41, as shown in FIG. 5, is constituted by a frame section 41a formed into a C-shape which is almost ¾ ring-shaped for supporting a rim portion of the wafer W and an arm section 41b which is integrally formed with the center portion of the frame section 41a and supports the frame section 41a. A stay 41c provided at the arm section 41b slides by a driving motor (not shown) and a belt (not shown) included in the carriage base 40 to thereby allow the whole tweezers 41 to move forward and rearward on the carriage base 40.

Three supporting members 50a, 50b and 50b for directly supporting the wafer W are provided on the frame section 41a. The supporting member 50a is attached at the nearest position to the arm section 41b and supporting members 50b and 50b are attached in the vicinity of the forward end portions of the frame section 41a respectively.

Figure 6:
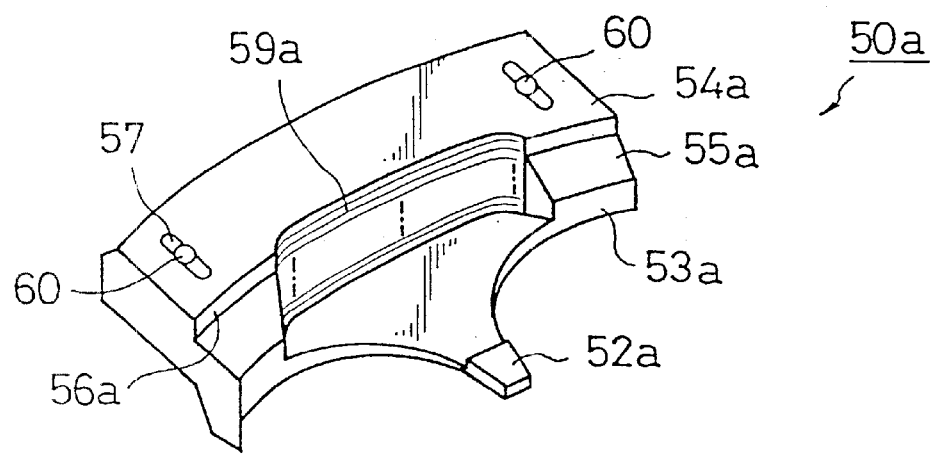
FIG. 6 is a perspective view of a supporting member which is provided on the base of a frame section of the tweezers in FIG. 5.

The supporting member 50a, as shown in FIG. 6, includes a rear face supporting section 52a on the front thereof for supporting a rear face of the wafer W, an arc section 53a circularly surrounding the rim portion of the wafer W, and a tapered face 55a as an inclined guide with an inclination of, for example, about 45 degrees. A vertical wall 56a which is formed continuing from an upper end of the tapered face 55a is formed between an upper face 54a of the supporting member 50a and the upper end of the tapered face 55a. A long hole 57 is made in the upper face 54a and the supporting member 50a is bolted to the frame section 41a with a bolt 60 having a size movable along a longitudinal direction inside the long hole 57.

Figure 7:
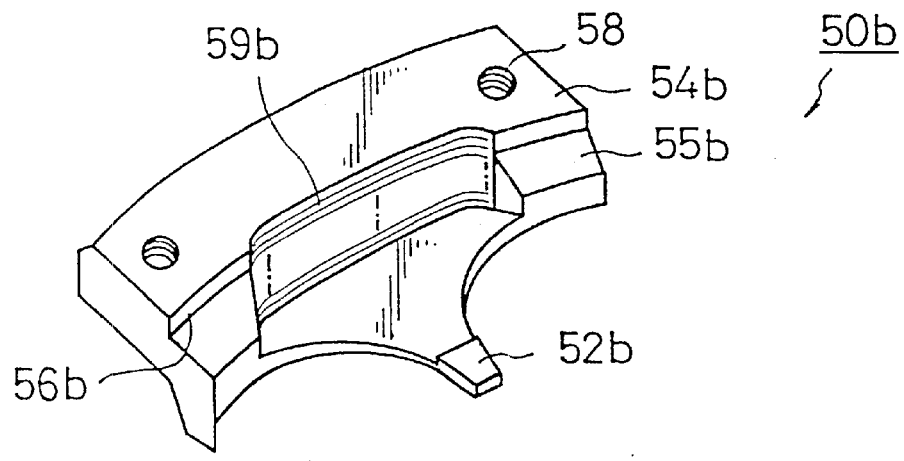
FIG. 7 is a perspective view of the supporting member which is provided on a forward end of the frame section of the tweezers in FIG. 5.

The supporting member 50b, as shown in FIG. 7, includes a rear face supporting section 52b on the front thereof for supporting a rear face of the wafer W similarly to the supporting member 50a, an arc section 53b circularly surrounding the rim portion of the wafer W, and a tapered face 55b with an inclination of, for example, about 45 degrees. A vertical wall 56b is formed between an upper face 54b of the supporting member 50b and an upper end of the tapered face 55b. A hole for screw 58 is made in the upper face 54b and the supporting member 50b is fixed to the frame section 41a by being screwed through the hole for screw 58.

In the respective supporting members 50a and 50b, the arc sections 53a and 53b are formed with, for example, about 2 mm in height and the vertical walls 56a and 56b are formed with, for example, about 1 mm in height, and both of the heights exceed about 0.7 mm which is the thickness of the wafer W.

Arc-shaped concave sections 59a and 59b are formed respectively on the rear face supporting sections 52a and 52b sides in the supporting members 50a and 50b. Therefore, portions of the rim portion of the wafer W corresponding to the concave sections 59a and 59b are free from touching.

The tweezers 41 according to the present embodiment is configured as described above. Next, functions and effects of the coating and developing system 1 provided with the main transfer unit 20 having the tweezers 41 will be explained below.

First, in the cassette station 10, the wafer carriage 15 approaches the cassette C which is mounted on the positioning projection 10a, and subsequently pulls out a wafer W from the cassette C. Thereafter, the wafer carriage 15 moves along the transfer path 15a to the alignment unit (ALIM) which is disposed in the third process unit group G3 and sends the wafer W into the alignment unit (ALIM).

When an orientation flat alignment and centering of the wafer W are completed in the alignment unit (ALIM), the wafer carriage 30 which is provided in the main transfer unit 20 moves to the vicinity of the alignment unit (ALIM) and the tweezers 41 advances upon operation of a driving motor (not shown). Subsequently, the tweezers 41 enters from below the wafer W which is mounted on the alignment unit (ALIM) and subsequently ascends to receive the wafer W.

Figure 8:
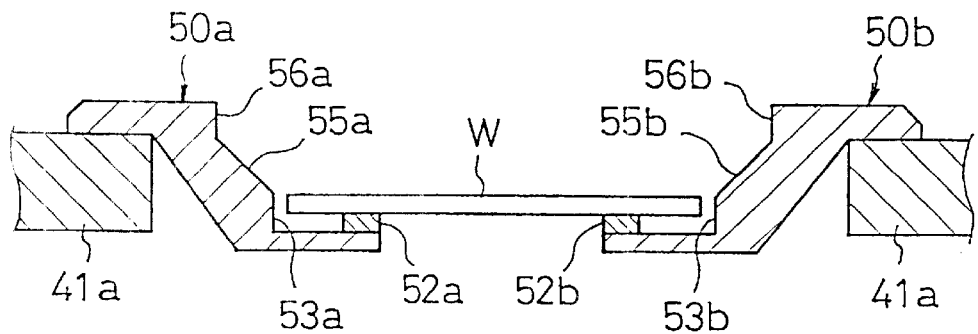
FIG. 8 is a sectional view showing the state of a wafer which is supported on a rear face supporting section of the tweezers in FIG. 5.
Figure 9:
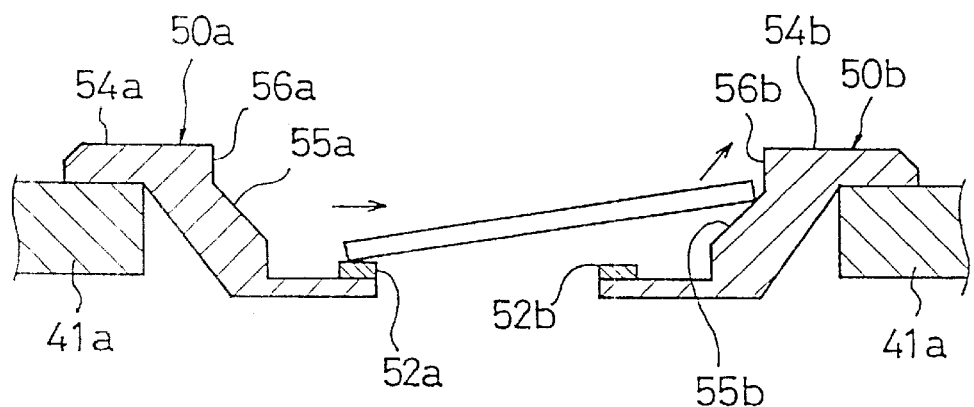
FIG. 9 is a sectional view showing the state of a rim portion of the wafer touching a tapered face of the supporting member in FIG. 7.

In this case, the wafer W is horizontally supported by the supporting members 50a, 50b, and 50b, as shown in FIG. 8. It sometimes happens that the wafer W held by the tweezers 41 is not supported on the rear face supporting sections 52a, 52b, and 52b but positioned in such a manner that the rim portion thereof touches the tapered face 55b, for example, as shown in FIG. 9. When the tweezers 41 are moved with the above state, the rim portion of the wafer W touching the tapered face 55b rises along the tapered face 55b in a direction shown with an arrow. Consequently, there is the possibility that the wafer W falls from the tweezers 41.

In the tweezers 41 according to the present embodiment, however, the vertical wall 56b is formed above the tapered face 55b, thereby avoiding a fall of the wafer W.

Figure 10:
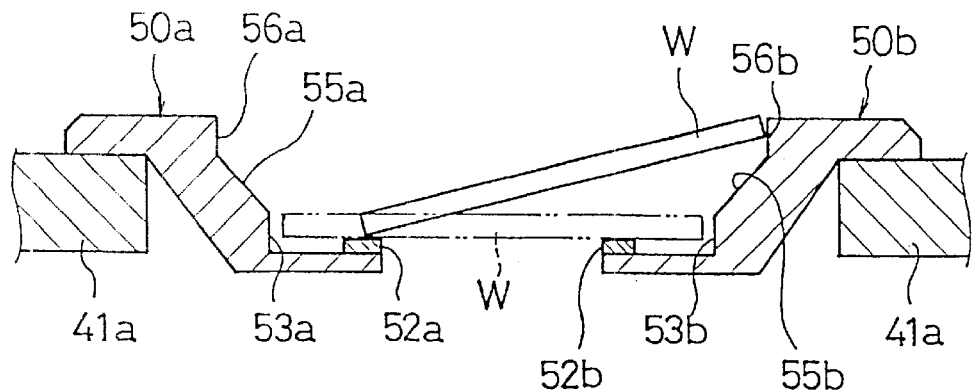
FIG. 10 is a sectional view showing the state of the wafer of which the rim portion hits against a vertical wall of the supporting member in FIG. 7 sliding down along the tapered face.

In other words, even when the wafer W rises along the tapered face 55b with retreat of the tweezers 41, a part of the rim portion of the wafer W touching the tapered face 55b hits against the vertical wall 56b as shown with a solid line in FIG. 10. Therefore, the rim portion of the wafer W touching the rear face supporting section 52a does not move toward the supporting member 50b side, so that the wafer W can be prevented from falling from the tweezers 41.

Furthermore, in the present embodiment, the height of the vertical wall 56b exceeds the thickness of the wafer W, so that the rim portion of the wafer W touching the tapered face 55b hits against the vertical wall 56b to stop with ease. Therefore, the wafer W can be further securely prevented from falling from the tweezers 41.

After the rim portion of the wafer W hits against the vertical wall 56b, the rim portion of the wafer W touching the tapered face 55b slides down along the tapered face 55b and is supported at the predetermined position on the rear face supporting section 52b.

In this case, the tapered face 55b is provided with the concave section 59b, therefore a touching area between the rim portion of the wafer W and the tapered face 55b is smaller than the case in which the concave section 59b is not formed. Accordingly, the wafer W can easily slide down from the position shown with a solid line in FIG. 10 to the position shown with a two-dotted chain line in the same drawing.

Additionally, the touching area between the rim portion of the wafer W and the tapered face 55b is small due to the concave section 59b, so that heat interference which occurs between the wafer W and the supporting member 50b decreases, and the possibility that the wafer W receives thermal bad effects from the supporting member 50b side is reduced.

As described above, the rim portion of the wafer W slides down along the tapered face 55b and the rim portion of the wafer W touching the rear face supporting section 52a moves from the supporting member 50b side to the supporting member 50a side on the rear face supporting section 52a, thereby the wafer W is horizontally supported at the predetermined position by the rear face supporting sections 52a, 52b, and 52b. Accordingly, the moving speed of the wafer W can be increased more than that of the conventional one and throughput can be improved.

The wafer W to be held by the tweezers has been positioned at the center of the frame section by moving and slightly adjusting all of the three supporting members provided on the tweezers by an operator in the conventional process. Therefore, it is troublesome to place the wafer W at the center of the frame section and the slight adjustment as above is the burden to the operator.

Figure 11:
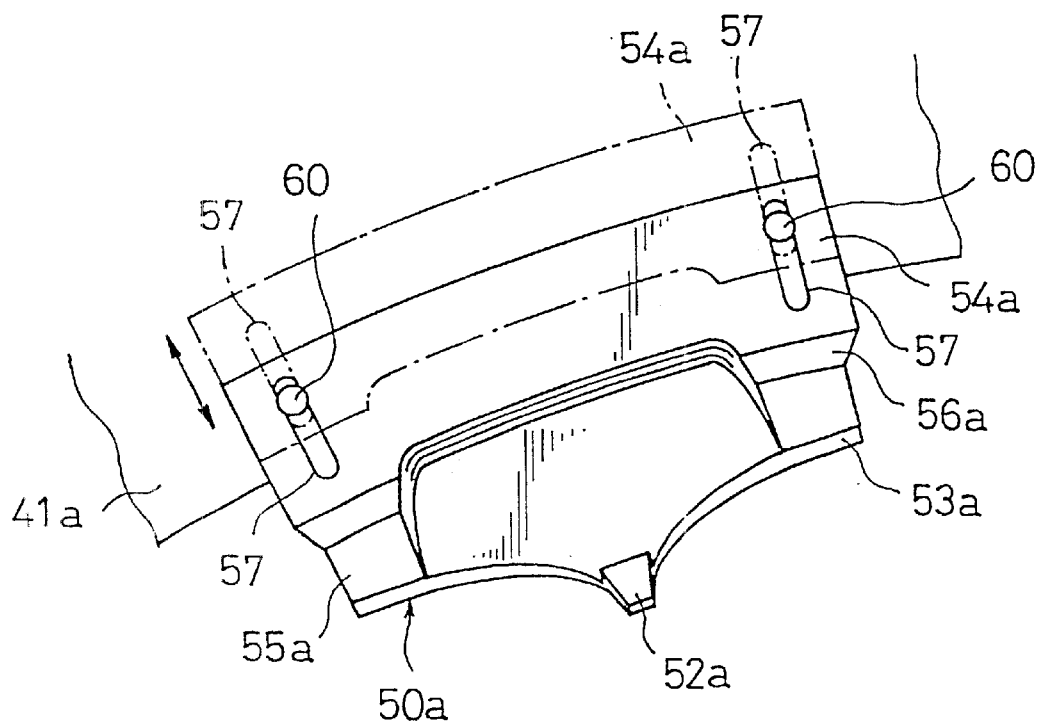
FIG. 11 is an explanatory view showing the state of the supporting member in FIG. 6 sliding to the frame section.
Figure 12:
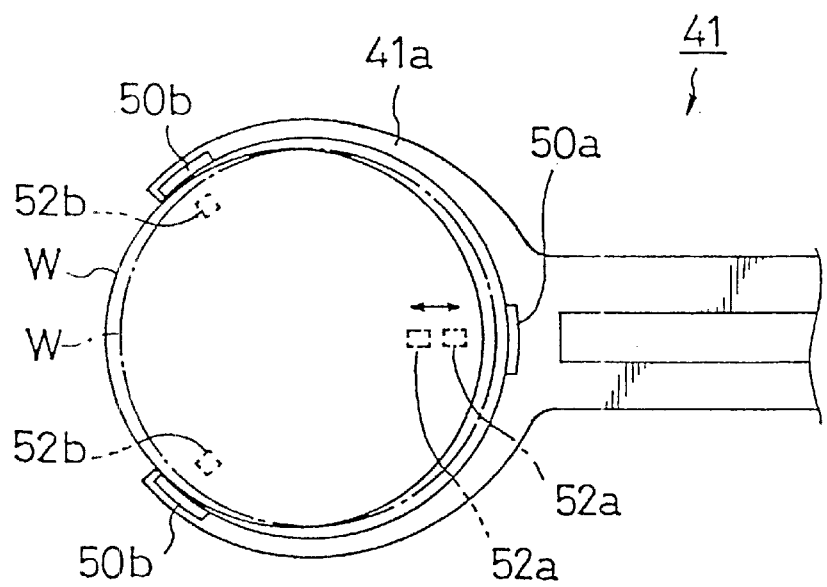
FIG. 12 is an explanatory view showing the state of the wafer being positioned at the center of the frame section by slightly adjusting the supporting member in FIG. 6.

In this point of view, the wafer W to be held by the tweezers 41 can be placed at the center of the frame section 41a by moving the rear face supporting section 52a of the supporting member 50a as shown in FIG. 12, since only the supporting member 50a is slidable to the frame section 41a, as shown in FIG. 11, in the tweezers 41 according to the embodiment of the present invention. In other words, the number of the supporting members to be slightly adjusted in the tweezers 41 is less than that in the prior art, thereby facilitating positioning the supporting members.

In the description of the above embodiment, the case in which the rim portion of the wafer W hits against the vertical wall 56b of the supporting member 50b is explained. There can be a case that the rim portion of the wafer W hits against the vertical wall 56a of the other supporting member 50a. In this case, it is obvious that the similar operation effects to the above embodiment can be obtained.

Figure 13:
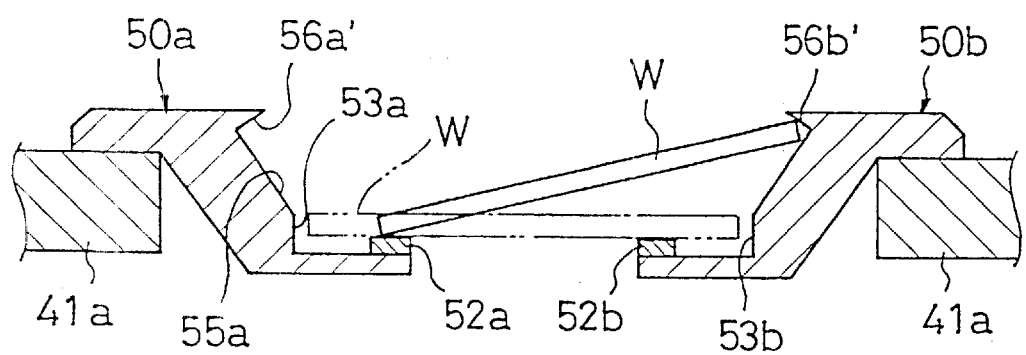
FIG. 13 is an explanatory view showing the state of the supporting member having an inclined wall engaging the wafer.

In the aforesaid embodiment, the vertical walls 56a and 56b are applied, but instead of those, inclined walls 56a' and 56b' which are further inclined toward the wafer W side held by the rear face supporting sections 52a and 52b may be formed respectively as shown in FIG. 13.

By applying the inclined walls 56a' and 56b' the rim portion of the substrate is further easily engaged than the case of applying the vertical walls 56a and 56b, thereby improving the function as a stopper for preventing the wafer W from falling. Accordingly, the wafer W can be further securely prevented from falling from the tweezers 41.

The tapered face 55a and the inclined wall 56a' and the tapered face 55b and the inclined wall 56b' can be formed to be perpendicular to each other respectively, thereby also further improving the function as a stopper than the aforesaid embodiment.

In addition, the height of each of the vertical walls 56a and 56b is 1 mm. The present invention, however, is not limited to the above example. The length of inclination of each tapered face 55a and 55b may be shortened and each vertical walls 56a and 56b may be formed higher than 1 mm, for example.

Furthermore, the example is described in which the wafer W is used as a substrate. The present invention, however, is not limited to the above example. It is also applicable to an example in which an LCD substrate, for example, is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for holding a substrate comprising:
   a frame section formed surrounding a half or more of a periphery of said substrate;
   an arm section supporting said frame section; and
   a plurality of supporting members provided on an inner periphery of said frame section, each of said supporting members having an inclined guide which allows a rim portion of said substrate to slide down and be guided to a predetermined position, a rear face supporting section which supports a rear face of said substrate slid down along said inclined guide and a vertical wall formed continuously with said inclined guide and being nearly perpendicular to a supported face of said substrate at an upper end of said inclined guide, said supporting members each have a concave section formed on a side where said substrate is supported and said inclined guide and said vertical wall are formed on the both sides of the concave section in said supporting member.

2. The apparatus according to claim 1, wherein said frame section is formed into a C-shape.

3. The apparatus according to claim 1, wherein said supporting member is disposed at least in a vicinity of a position where said frame section is supported by said arm section.

4. The apparatus as set forth claim 3, wherein said supporting member which is disposed in the vicinity of the position where said frame section is supported by said arm section is slidable in a direction to the center of said substrate supported at the predetermined position and fixable within a slidable area.

5. The apparatus according to claim 4, wherein said supporting member which is disposed in the vicinity of the position where said frame section is supported by said arm section, in which a long hole is made, is bolted to said frame section through the long hole.

6. The apparatus according to claim 3, wherein at least three of said supporting members, including a supporting member which is disposed in the vicinity of the position where said frame section is supported by said arm section, are provided on the inner periphery of said frame section.

7. The apparatus according to claim 6, wherein said supporting members include two support members attached in a vicinity of forward end portions of said frame section, respectively.

8. The apparatus according to claim 1, wherein said vertical wall has a height larger than a thickness of said substrate.

9. An apparatus for holding a substrate comprising:
a frame section formed surrounding a half or more of a periphery of said substrate;
an arm section supporting said frame section; and
a plurality of supporting members provided on the inner periphery of said frame section, each of said supporting members having an inclined guide which allows a rim portion of said substrate to slide down to be guided to a predetermined position, a rear face supporting section which supports a rear face of said substrate slide down along said inclined guide, and an inclined wall formed continuously with said inclined guide and being inclined toward an inclined guide side further from a perpendicular direction relative to a supported face of said substrate at an upper end of said inclined guide, said supporting members each have a concave section formed on a side where said substrate is supported and said inclined guide and said vertical wall are formed on the both sides of the concave section in said supporting member.

10. The apparatus according to claim 9, wherein said inclined wall is nearly perpendicular to said inclined guide.

11. A process system for processing a substrate comprising:
a plurality of process units performing a predetermined process respectively to said substrate; and
a transfer apparatus having a pair a tweezers which are moveable forward and backward to each process unit for giving and receiving said substrate between said process units; and
wherein said tweezers include:
a frame section formed surrounding a half or more of a periphery of said substrate;
an arm section supporting said frame section; and
a plurality of supporting members provided on the inner periphery of said frame section, each of said supporting members having an inclined guide which allows a rim portion of said substrate to slide down to be guided to a predetermined position, a rear face supporting section which supports a rear face of said substrate slide down along said inclined guide and a vertical wall formed continuously with said inclined guide and being nearly perpendicular to a supported face of said substrate at an upper end of said inclined guide, a concave section is formed on a side where said substrate is supported and said inclined guide and said vertical wall are formed on the both sides of the concave section in said supporting member.

12. A process system for processing a substrate comprising:
a plurality of process units performing a predetermined process respectively to said substrate; and
a transfer apparatus having a pair of tweezers which is moveable forward and backward to each process unit for giving and receiving said substrate between said process units; and
wherein said tweezers include:
a frame section formed surrounding a half or more of a periphery of said substrate;
an arm section supporting said frame section; and
a plurality of supporting members provided on the inner periphery of said frame section having an inclined guide which allows a rim portion of said substrate to slide down to be guided to a predetermined position, a rear face supporting section which supports a rear face of said substrate slide down along said inclined guide, and an inclined wall formed continuously with said inclined guide and being inclined toward an inclined guide side further from a perpendicular direction relative to a supported face of said substrate at an upper end of said inclined guide, a concave section is formed on a side where said substrate is supported and said inclined guide and said vertical wall are formed on the both sides of the concave section in said supporting member.

13. The apparatus as set forth in claim 12, wherein the supporting member, which is disposed in a vicinity of a position where said frame section is supported by said arm section, is slidable in a direction to a center of said substrate which is supported at the predetermined position, and fixable within the slidable area.

* * * * *